United States Patent
Cram

(10) Patent No.: US 7,265,563 B2
(45) Date of Patent: Sep. 4, 2007

(54) TEST METHOD FOR SEMICONDUCTOR COMPONENTS USING ANISOTROPIC CONDUCTIVE POLYMER CONTACT SYSTEM

(75) Inventor: Daniel P. Cram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 97 days.

(21) Appl. No.: 11/152,712

(22) Filed: Jun. 15, 2005

(65) Prior Publication Data

US 2005/0253610 A1 Nov. 17, 2005

Related U.S. Application Data

(62) Division of application No. 10/667,990, filed on Sep. 22, 2003, now Pat. No. 7,038,475, which is a division of application No. 10/037,607, filed on Jan. 7, 2002, now Pat. No. 6,856,151, which is a division of application No. 09/652,826, filed on Aug. 31, 2000, now Pat. No. 6,462,568.

(51) Int. Cl.
*G01R 1/073* (2006.01)

(52) U.S. Cl. .................... 324/754; 324/755; 324/757

(58) Field of Classification Search ............ None
See application file for complete search history.

(56) References Cited

U.S. PATENT DOCUMENTS

| | | | |
|---|---|---|---|
| 3,767,519 A | | 10/1973 | Kojima et al. |
| 4,528,500 A | * | 7/1985 | Lightbody et al. ........... 324/537 |
| 4,571,542 A | * | 2/1986 | Arai ............................ 324/537 |
| 4,574,235 A | * | 3/1986 | Kelly et al. ................. 324/754 |
| 4,707,657 A | * | 11/1987 | Boegh-Petersen ........... 324/537 |
| 4,833,402 A | * | 5/1989 | Boegh-Petersen ........... 324/754 |
| 4,961,052 A | * | 10/1990 | Tada et al. .................. 324/754 |
| 5,109,596 A | * | 5/1992 | Driller et al. ................. 29/705 |
| 5,132,058 A | * | 7/1992 | Suyama et al. ............. 264/437 |
| 5,163,834 A | | 11/1992 | Chapin et al. |
| 5,171,290 A | * | 12/1992 | Olla et al. ..................... 439/71 |
| 5,302,891 A | | 4/1994 | Wood et al. |
| 5,317,255 A | | 5/1994 | Suyama et al. |
| 5,371,255 A | * | 12/1994 | Mentink et al. ............ 554/199 |
| 5,492,863 A | | 2/1996 | Higgins, III |
| 5,509,203 A | * | 4/1996 | Yamashita ................... 29/879 |
| 5,574,382 A | * | 11/1996 | Kimura ....................... 324/754 |
| 5,670,889 A | * | 9/1997 | Okubo et al. ............... 324/760 |

(Continued)

*Primary Examiner*—Ernest Karlsen
(74) *Attorney, Agent, or Firm*—Stephen A. Gratton

(57) ABSTRACT

A contact system for electrically engaging semiconductor components includes an interface board mountable to an automated test handler, and a floating substrate on the interface board. The interface board includes interface contacts in electrical communication with external test circuitry. The substrate includes flexible segments, and contactors having contact pads on opposing sides of the flexible segments configured to simultaneously electrically engage terminal contacts on the components, and the interface contacts on the interface board. The contact pads include conductive polymer layers that provide an increased compliancy for the contactors. This increased compliancy allows the contactors to accommodate variations in the dimensions and planarity of the terminal contacts on the component. In addition, the substrate includes grooves between the contactors which provide electrical isolation and allow the contactors to move independently of one another. An alternate embodiment contact system includes a Z-axis conductive polymer layer between the substrate and the interface board. Also provided are test methods employing the contact systems.

17 Claims, 6 Drawing Sheets

U.S. PATENT DOCUMENTS

| | | | |
|---|---|---|---|
| 5,798,655 A * | 8/1998 | Kazama et al. | 324/761 |
| 5,894,217 A | 4/1999 | Igarashi et al. | |
| 5,945,834 A * | 8/1999 | Nakata et al. | 324/754 |
| 6,005,401 A * | 12/1999 | Nakata et al. | 324/754 |
| 6,046,599 A | 4/2000 | Long et al. | |
| 6,064,217 A | 5/2000 | Smith | |
| 6,064,218 A | 5/2000 | Godfrey | |
| 6,072,324 A | 6/2000 | Farnworth | |
| 6,091,256 A | 7/2000 | Long et al. | |
| 6,114,864 A | 9/2000 | Soejima et al. | |
| 6,181,145 B1 * | 1/2001 | Tomita et al. | 324/754 |
| 6,181,149 B1 * | 1/2001 | Godfrey et al. | 324/761 |
| 6,204,681 B1 * | 3/2001 | Nagatsuka et al. | 324/754 |
| 6,215,321 B1 * | 4/2001 | Nakata | 324/754 |
| 6,232,791 B1 * | 5/2001 | Jitsumori et al. | 324/765 |
| 6,259,036 B1 | 7/2001 | Farnworth | |
| 6,263,566 B1 * | 7/2001 | Hembree et al. | 29/874 |
| 6,297,652 B1 * | 10/2001 | Shimoda et al. | 324/754 |
| 6,297,658 B1 * | 10/2001 | Nakata et al. | 324/765 |
| 6,329,829 B1 | 12/2001 | Farnworth et al. | |
| 6,333,555 B1 | 12/2001 | Farnworth et al. | |
| 6,407,563 B2 * | 6/2002 | Ohtaki | 324/754 |
| 6,462,568 B1 | 10/2002 | Cram | |
| 6,483,329 B1 | 11/2002 | Cram | |
| 6,492,599 B1 * | 12/2002 | Sugihara | 174/258 |
| 6,518,781 B2 * | 2/2003 | Masuda | 324/757 |
| 6,529,026 B1 | 3/2003 | Farnworth et al. | |
| 6,614,246 B1 * | 9/2003 | Kohno et al. | 324/754 |
| 6,720,787 B2 * | 4/2004 | Kimura et al. | 324/765 |
| 6,856,151 B1 | 2/2005 | Cram | |
| 6,939,142 B2 * | 9/2005 | Maruyama et al. | 439/66 |
| 7,038,475 B2 | 5/2006 | Cram | |
| 2001/0040464 A1 * | 11/2001 | Tanioka et al. | 324/765 |

* cited by examiner

TEST METHOD FOR SEMICONDUCTOR COMPONENTS USING ANISOTROPIC CONDUCTIVE POLYMER CONTACT SYSTEM

CROSS REFERENCE TO RELATED APPLICATIONS

This application is a division of Ser. No. 10/667,990 filed Sep. 22, 2003, U.S. Pat. No. 7,038,475, which is a division of Ser. No. 10/037,607 filed Jan. 7, 2002, U.S. Pat. No. 6,856,151 B1, which is a division of Ser. No. 09/652,826 filed Aug. 31, 2000, U.S. Pat. No. 6,462,568 B1.

FIELD OF THE INVENTION

This invention relates generally to the testing and assembly of semiconductor components, such as semiconductor packages, BGA devices and modules. More particularly, this invention relates to a conductive polymer contact system for electrically engaging semiconductor components, and to a test method employing the contact system.

BACKGROUND OF THE INVENTION

Semiconductor components, such as packages, BGA devices and modules, include terminal contacts in electrical communication with the integrated circuits and electronic devices contained on the components. For example, the terminal contacts on semiconductor packages can be in the form of leads, such as j-leads, gull wing leads, butt joint leads, or integral standoff leads. The terminal contacts on BGA devices and chip scale packages can be in the form of bumps, such as balls in a grid array (BGA). As another example, the terminal contacts on electronic modules, such as memory modules, can be in the form of pads, or alternately pins in a grid array (PGA).

In general, the terminal contacts on the components must be electrically engaged during, and following manufacture of the components. For example, for testing the components, temporary electrical connections are made with the terminal contacts, and test signals are transmitted through the terminal contacts. Test systems for testing semiconductor components include test boards and test circuitry in electrical communication with the test boards. The test boards can include interface boards having contactors configured to make temporary electrical connections with the terminal contacts on the components. Representative contactors include sockets, contact sets, and "POGO PINS".

In these test systems it is advantageous to make temporary electrical connections with the terminal contacts on the components that are reliable, and have low electrical resistance. This requires that the terminal contacts be scrubbed, or alternately penetrated by the contactors, such that oxide layers and surface contaminants on the terminal contacts do not adversely affect the temporary electrical connections. It is also advantageous for the contactors to accommodate variations in the height and planarity of the terminal contacts. This requires that the contactors have a compliancy or flexibility in making the temporary electrical connections. It is also advantageous for the contactors to be inexpensive to make and to maintain, and inexpensive to replace.

The contact system of the present invention includes contactors configured to make reliable, low resistance, temporary electrical connections with terminal contacts on semiconductor components. The contactors have an increased compliancy for accommodating variations in the size and planarity of the terminal contacts. The contactors are also configured to provide increased durability and wear resistance in a production environment. Further, the contact system can be volume manufactured at a low cost, permitting worn contactors to be easily replaced and discarded.

SUMMARY OF THE INVENTION

In accordance with the present invention, a contact system for electrically engaging semiconductor components, and a test method for testing semiconductor components, are provided. In illustrative embodiments, the contact system is configured to electrically engage components having terminal contacts in the form of leads, bumps or pads. In addition, the contact system and the test method are illustrated in the testing of semiconductor packages, BGA devices and modules.

In a first embodiment, the contact system includes an interface board having interface contacts in electrical communication with external circuitry (e.g., test circuitry). The contact system also includes a substrate on the interface board. The substrate is configured to float on the interface board, and is restrained by guide pins, fasteners, or a latching mechanism. The substrate preferably comprises a flexible, electrically insulating organic material, such as a glass filled resin (e.g., FR-4).

The substrate includes a pattern of contactors configured to simultaneously electrically engage the terminal contacts on the component, and the interface contacts on the interface board. The contactors include first contact pads on a first side of the substrate, and second contact pads on an opposing second side of the substrate. The contactors also include conductive vias electrically connecting the first contact pads to the second contact pads. The contact pads preferably comprise a non-oxidizing metal, such as gold or platinum, covered with a conductive polymer layer, such as silver filled epoxy. The first contact pads, and the conductive polymer layers thereon, are configured to electrically engage the terminal contacts on the component. The second contact pads, and the conductive polymer layers thereon, are configured to electrically engage the interface contacts on the interface board. The substrate also includes grooves (e.g., saw cuts) between the contactors, which form flexible segments for the contactors, and provide electrical isolation for the contactors.

With the contact system, the terminal contacts on the component are aligned with, and then placed on the first contact pads. The component is then pressed against the substrate using a suitable mechanism, such as a test handler. The conductive polymer layers on the first contact pads electrically engage the terminal contacts on the component, with the conductive particles therein (e.g., silver particles) penetrating oxide layers on the terminal contacts. Similarly, the conductive polymer layers on the second contact pads electrically engage the interface contacts on the interface board. The resiliency of the conductive polymer layers, along with the flexibility of the substrate and the flexible segments, provide an increased compliancy for the contactors. This increased compliancy allows the contactors to accommodate variations in the dimensions and planarity of the terminal contacts on the component.

In a second embodiment, the contact system again includes an interface board having interface contacts in electrical communication with external circuitry (e.g., test circuitry). The contact system also includes a substrate on the interface board. As with the first embodiment, the substrate is configured to float on the interface board, and is restrained by guide pins, fasteners, or a latching mechanism. In addition, the substrate includes a pattern of contactors configured to simultaneously electrically engage the terminal contacts on the component, and the interface contacts on the interface board.

As with the first embodiment, the contactors include contact pads on a first side of the substrate, second contact pads on an opposing second side of the substrate, and conductive vias electrically connecting the first contact pads to the second contact pads. The first contact pads are configured to electrically engage the terminal contacts on the component. The second contact pads are configured to electrically engage the interface contacts on the interface board. However in the second embodiment, an anisotropic conductive polymer layer on the second side of the substrate provides Z-axis conductive paths between the second contact pads and the interface contacts on the interface board. In addition, the substrate again includes slots (e.g., saw cuts) between the contactors, which form flexible segments on the substrate, and provide electrical isolation for the contactors.

A test method performed with the first embodiment contact system includes the steps of: providing an interface board comprising a plurality of interface contacts in electrical communication with test circuitry; providing a floating substrate on the interface board; providing a plurality of movable test contactors on the substrate comprising first contact pads with conductive polymer layers thereon configured to electrically engage the terminal contacts and second contact pads with conductive polymer layers thereon in electrical communication with the first contact pads and configured to electrically engage the interface contacts; placing the component on the substrate with the terminal contacts in electrical communication with the first contact pads and the interface contacts in electrical communication with the second contact pads; and applying test signals through the test contactors and the terminal contacts to the component.

A test method performed with the second embodiment contact system includes the steps of: providing an interface board comprising a plurality of interface contacts in electrical communication with test circuitry; providing a floating substrate on the interface board; providing a plurality of movable test contactors on the substrate comprising first contact pads configured to electrically engage the terminal contacts and second contact pads in electrical communication with the first contact pads and with an anisotropic conductive polymer layer configured to electrically engage the interface contacts; placing the component on the substrate with the terminal contacts in electrical communication with the first contact pads and the interface contacts in electrical communication with the second contact pads; and applying test signals through the test contactors and the terminal contacts to the component.

DETAILED DESCRIPTION OF THE PREFERRED EMBODIMENTS

Referring to FIGS. 1A-1J, various prior art semiconductor components suitable for use with a contact system constructed in accordance the invention are illustrated. As used herein the term semiconductor component refers to an element that includes a semiconductor die having integrated circuits and semiconductor devices thereon.

Figure 1A:
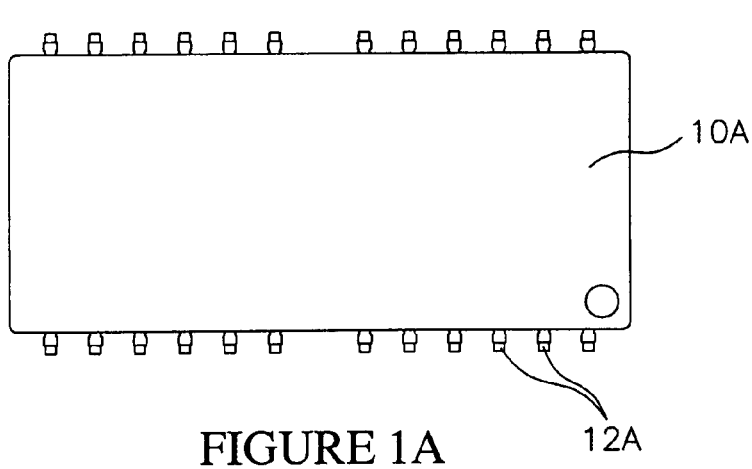
FIG. 1A is a plan view of a prior art semiconductor component (package) suitable for use with the contact system of the invention.
Figure 1B:
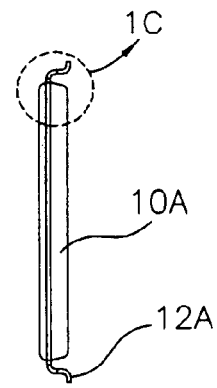
FIG. 1B is a end elevation view of FIG. 1A.
Figure 1C:
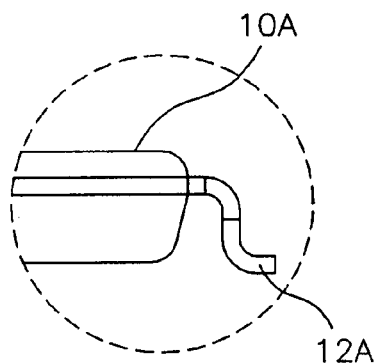
FIG. 1C is an enlarged view taken along line 1C of FIG. 1B illustrating a terminal contact (gull wing lead) on the component.
Figure 1D:
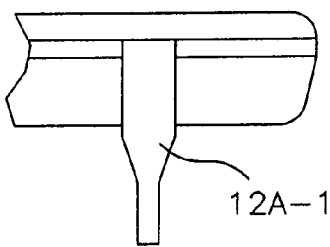
FIG. 1D is an enlarged view equivalent to FIG. 1C illustrating an alternate embodiment prior art terminal contact (integral standoff lead)
Figure 1E:
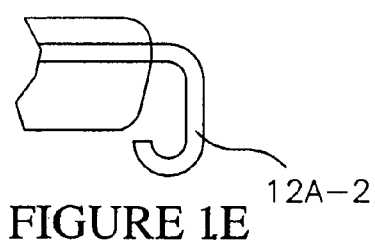
FIG. 1E is an enlarged view equivalent to FIG. 1C illustrating an alternate embodiment prior art terminal contact (j-bend lead)

In FIGS. 1A-1C, a semiconductor component 10A comprises a conventional plastic semiconductor package having terminal contacts 12A in the form of metal leads. More specifically, the component 10A has the configuration of a thin small outline package (TSOP), and the terminal contacts 12A have a gull wing configuration.

Figure 1F:
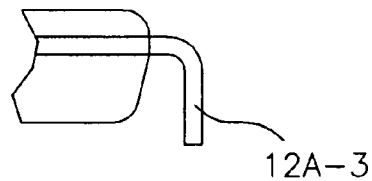
FIG. 1F is an enlarged view equivalent to FIG. 1C illustrating an alternate embodiment prior art terminal contact (butt joint lead)

Alternately, the component 10A can have the configuration of any conventional semiconductor package including quad flat pack (OFP), dual in line package (DIP), zig zag in line package (ZIP), small outline j-bend (SOJ), and leadless chip carrier (LCC). Other exemplary configurations for the terminal contacts 12A include integral standoff leads 12A-1 (FIG. 1D), J-bend leads 12A-2 (FIG. 1E) and butt joint leads 12A-3 (FIG. 1F). Alternately the terminal contacts 12A can be in the form of bumps, balls, pads or pins.

Figure 1G:
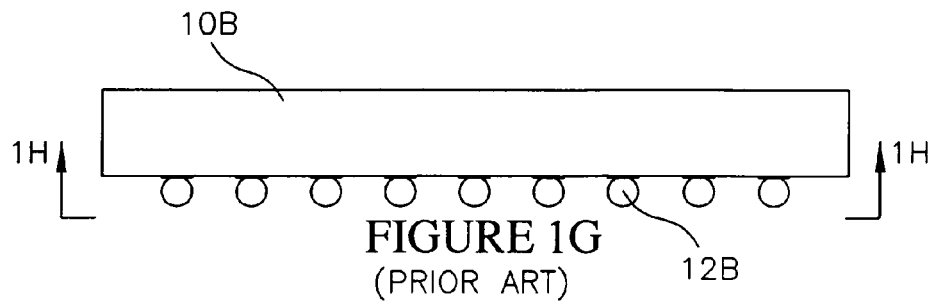
FIG. 1G is a side elevation view of a prior art semiconductor component (BGA device or chip scale package) suitable for use with the contact system of the invention.
Figure 1H:
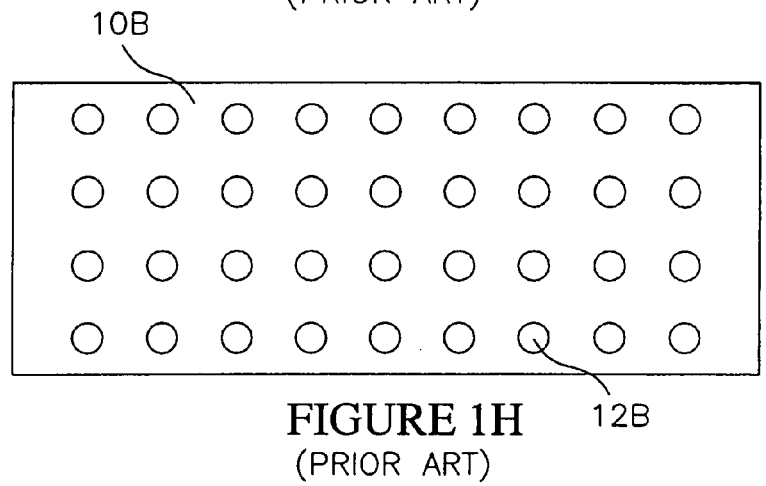
FIG. 1H is a bottom view of the component of FIG. 1G taken along line 1H-1H.
Figure 1I:
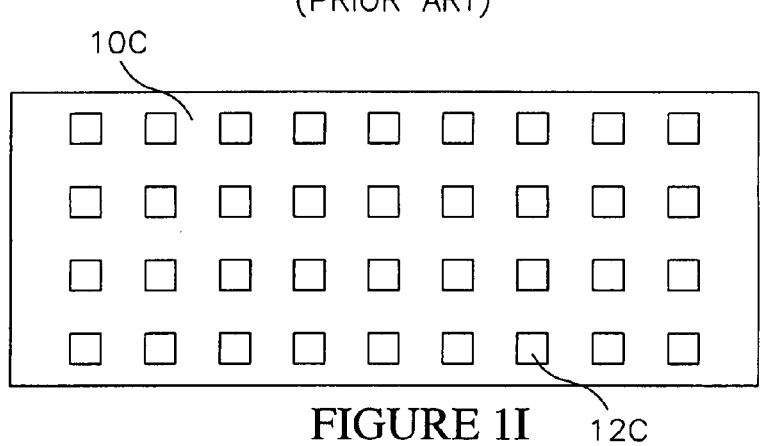
FIG. 1I is a bottom view of a prior art semiconductor component (module) suitable for use with the contact system of the invention.

In FIGS. 1G and 1H, a semiconductor component 10B comprises a conventional ceramic package, chip scale package or grid array device having bumped terminal contacts 12B in the form of metal balls, bumps or pins in a dense grid array (e.g., BGA, FBGA, PGA). In FIG. 1I, a semiconductor component 10C comprises a module having planar terminal contacts 12C in the form of planar pads in a grid array (PGA).

Referring to FIGS. 2A-2G, a contact system 16 constructed in accordance with the invention is illustrated. The contact system 16 is configured to test the component 10A with the terminal leads 12A. However, it is to be understood that the contact system 16 can be configured for electrically engaging any of the previously described semiconductor components.

The contact system 16 includes an interface board 18, which is configured for mounting to an automated or manual test handler 14. The test handler 14 is schematically represented by a block in FIG. 2A. Support, movement and indexing of the component 10A can be provided by the test handler 14. Suitable automated test handlers are commercially available from Advantest Corporation, Tokyo, Japan, as well as other manufacturers.

The interface board 18 comprises an electrically insulating material, such as molded plastic, a glass filled resin (e.g., FR-4) or a ceramic. In addition, the interface board 18 includes a pattern of interface contacts 20 in electrical communication with test circuitry 22. The test circuitry 22 is configured to generate and apply test signals to the integrated circuits contained on the component 10A, and to analyze the resultant signals. Suitable test circuitry is commercially available from Advantest Corporation of Tokyo, Japan, and Teradyne of Boston, Mass., as well as other manufacturers.

The interface contacts 20 can be formed in a pattern (size and spacing) that matches a pattern of the terminal contacts 12A on the component 10A. The interface contacts 20 can comprise a highly conductive metal, such as copper or aluminum. In addition, the interface board 18 can include conductors 24, such as conductive traces, and metal filled vias that electrically connect the interface contacts 20 to the test circuitry 22.

In addition to the interface board 18, the contact system 16 also includes a substrate 26 on the interface board 18. The substrate 26 is configured to float on the interface board 18, and is restrained by guide pins 28 (FIG. 2B) attached to the interface board 18. Openings 30 (FIG. 2B) in the substrate 26 are sized to allow free sliding movement of the substrate 26 on the interface board 18 in the Z-direction. At the same time, the openings 30 (FIG. 2B) have an inside diameter that is only slightly larger than the outside diameter of the guide pins 28 (e.g., one to several mils), such that the substrate 26 is accurately located in the X and Y directions on the interface board 18. Alternately, in place of the guide pins 28, fasteners, or a latching mechanism can be used to restrain the substrate 26 on the interface board 18.

The substrate 26 preferably comprises a flexible, electrically insulating organic material, such as a glass filled resin (e.g., FR-4). In addition, the substrate 26 includes a pattern of contactors 32 configured to simultaneously electrically engage the terminal contacts 12A on the component 10A, and the interface contacts 20 on the interface board 18. The substrate 26 also includes grooves 52, such as saw cuts, that electrically isolate the contactors 32 from one another. In addition, the grooves increase the flexibility, or compliancy of the contactors 32.

Figure 2A:
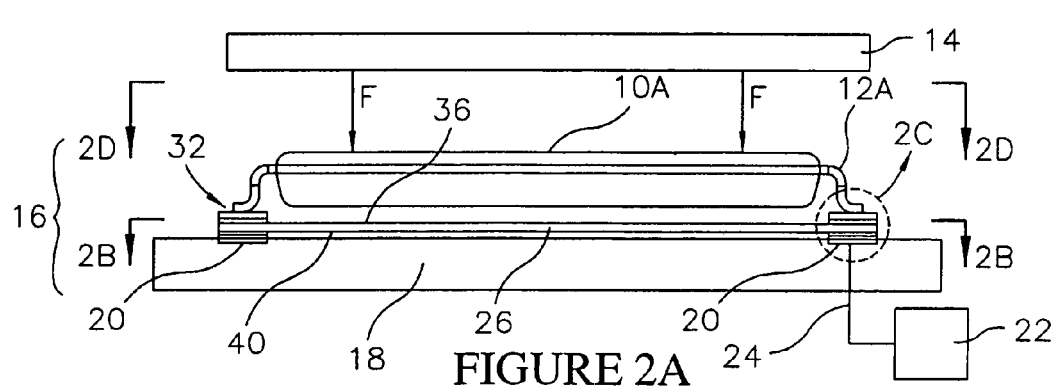
FIG. 2A is an end elevation view of a first embodiment conductive polymer contact system constructed in accordance with the invention.
Figure 2B:
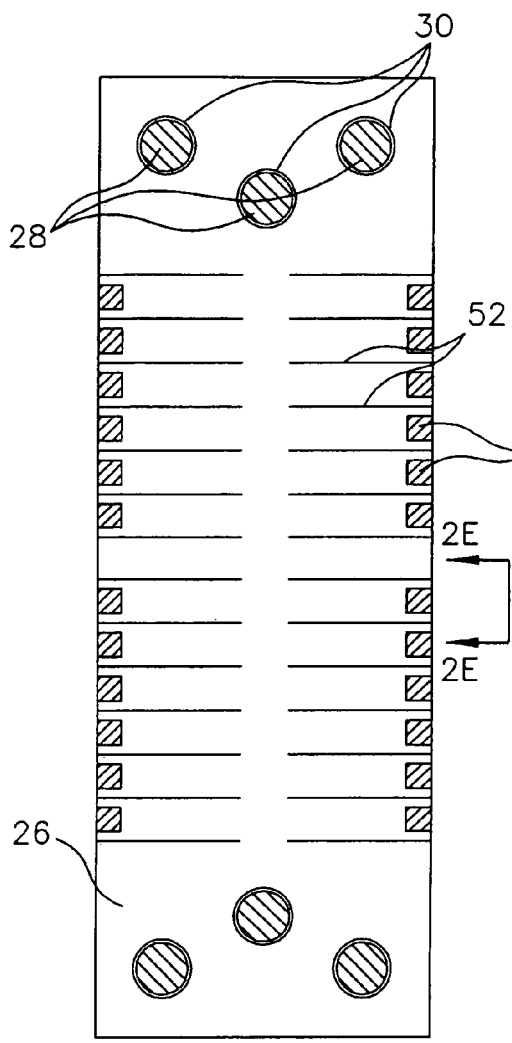
FIG. 2B is a cross sectional view taken along section line 2B-2B of FIG. 2A.
Figure 2C:
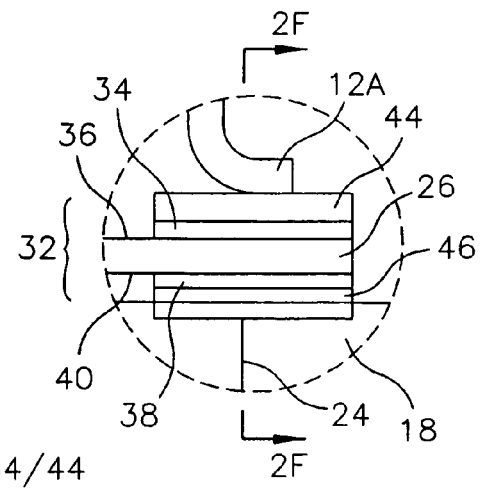
FIG. 2C is an enlarged view taken along line 2C of FIG. 2A.

As shown in FIG. 2C, the contactors 32 include first contact pads 34 on a first side 36 of the substrate 26, and second contact pads 38 on an opposing second side 40 of the substrate 26. The contact pads 34, 38 preferably comprise a non-oxidizing metal, such as gold or platinum. As shown in FIG. 2F, the contactors 32 also include conductive vias 42 which electrically connect the first contact pads 34 to the second contact pads 38. The pattern of the first contact pads 34 exactly matches the pattern of the terminal contacts 12A on the component 10A. In addition, although the first contact pads 34 and the second contact pads 38 are shown as having matching patterns, the second contact pads 38 can be offset, or "fanned out" from the contact pads 34. In this case the interface contacts 20 on the interface board 18 would also be offset, or fanned out, with respect to the first contact pads 34.

The first contact pads 34 include a first conductive polymer layer 44, and the second contact pads 38 include a second conductive polymer layer 46. As shown in FIG. 2G, the conductive polymer layers 44, 46 comprises an elastomeric matrix material 48 having conductive particles 50A, or conductive particles 50B embedded therein. Suitable elastomeric matrix materials 48 include epoxy, silicone, natural rubber, synthetic rubber, and similar elastomeric materials having suitable compressive and adhesive characteristics.

As also shown in FIG. 2G, the conductive particles 50A comprise electrically conductive metal particles, such as silver, in a sliver configuration. The conductive particles 50B comprise dendritic metal particles, such as silver, in a crystal, or snow flake, configuration. Although the conductive polymer layers 44, 46 are illustrated as including both types of conductive particles 50A, 50B, it is to be understood that the conductive polymer layers 44, 46 can include either type of conductive particle 50A, 50B. In either case the conductive particles 50A, 50B are configured to provide an isotropic electrically conductive path through the elastomeric matrix material 48 (e.g., electrically conductive in all directions). In addition, the conductive particles 50A, 50B function to penetrate oxide layers on the terminal contacts 12A, and on the interface contacts 20 such that low resistance electrical connections are made with the component 10A and the interface board 18.

The conductive polymer layers 44, 46 can comprise a conventional commercially available composition. Suitable conductive polymers are commercially available from different manufacturers including Shinetsu Chemical Co., Japan; EPI Technologies, Richardson Tex.; A.I. Technology, Trenton N.J.; and Sheldahl, Northfield, Minn.

The conductive polymer layer 44, 46 can be deposited on the contacts pads 34, 38 using a deposition process. Exemplary deposition methods include screen printing and stenciling. With screen printing a stainless steel or monofilament polyester screen can be stretched and attached to a metal frame. A negative pattern can then be generated on the mesh using a photosensitive emulsion. The conductive polymer material can then be forced through the screen and onto the first contact pads 34 or the second contact pads 38. To facilitate the screen printing process the conductive polymer material can be in a liquid or viscous condition and then cured such as by outgassing a solvent. Another exemplary deposition method for the bumps comprises deposition of the conductive polymer material using a positive displacement dispensing mechanism, such as a syringe or screw dispenser apparatus.

Figure 2E:
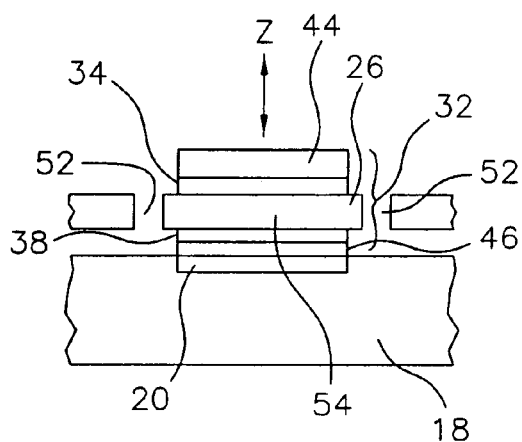
FIG. 2E is an enlarged side view taken along line 2E-2E of FIG. 2B.
Figure 2F:
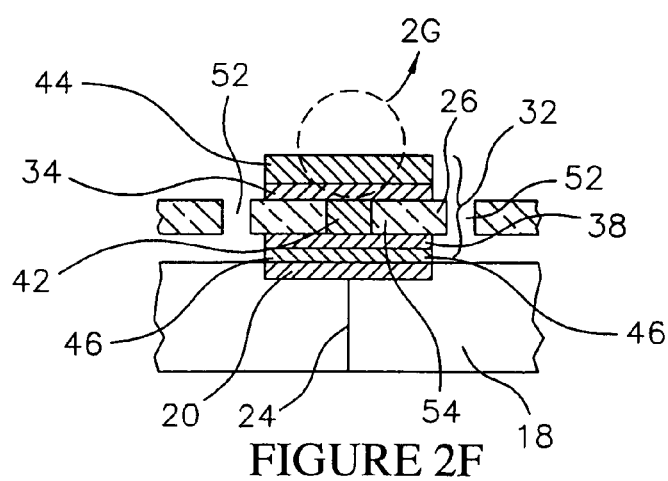
FIG. 2F is an enlarged cross sectional view taken along section line 2F-2F of FIG. 2C.
Figure 2G:
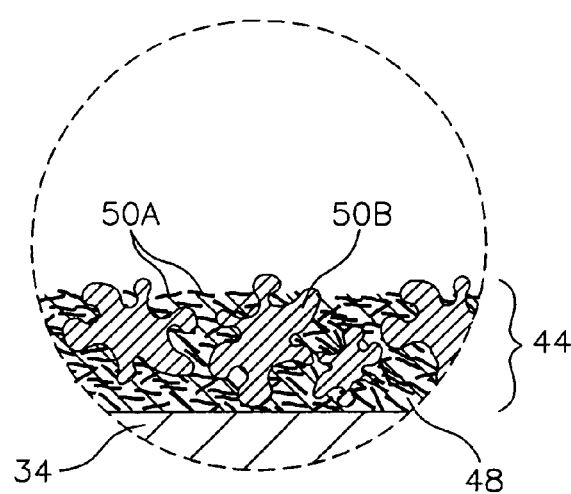
FIG. 2G is an enlarged cross sectional view taken along line 2G of FIG. 2F.

As shown in FIG. 2E, the conductive polymer layers 44, 46 have a natural resiliency that provides compliancy or compressibility for the contactors 32 in the Z direction. In addition, the grooves 52 in the substrate 26 locate each contactor 32 on a separate flexible segment 54 of the substrate 26. The compliancy of the conductive polymer layers 44, 46 and the flexibility of the substrate 26 and the flexible segments 54 thereon, allow the contactors 32 to compress and move independently of one another to accommodate variations in the height and planarity of the terminal contacts 12A on the component 10A. In addition, the component 10A can be overdriven by the test handler 14 (FIG. 2A) with a force F (FIG. 2A) into the contactors 32 to take advantage of the compliancy and flexibility of the contactors 32.

Figure 2D:
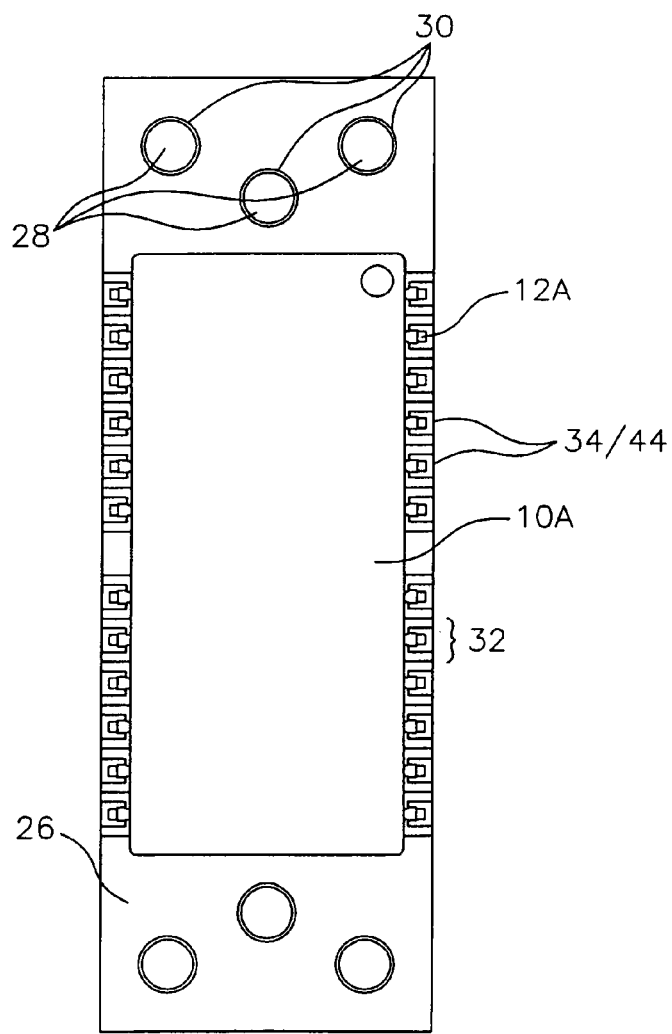
FIG. 2D is a plan view taken along line 2D-2D of FIG. 2A.

As shown in FIG. 2D, during a test process, the component 10A is placed on the substrate 26 with the terminal contacts 12A aligned with the contactors 32. The test handler 14 (FIG. 2A) aligns and places the component 10A on the substrate 26. Under the force F applied by the test handler 14, the component 10A is pressed against the substrate 26, such that the terminal contacts 12A electrically engage the first contact pads 34 and the first conductive polymer layers 44 thereon. At the same time, the second contact pads 38 (FIG. 2F) and the conductive polymer layers 46 (FIG. 2F) thereon electrically engage the interface contacts 20 on the interface board 18. This establishes electrical communication between the test circuitry 22 (FIG. 2A) and the component 10A such that test signals can be applied to the component 10A.

Figure 2H:
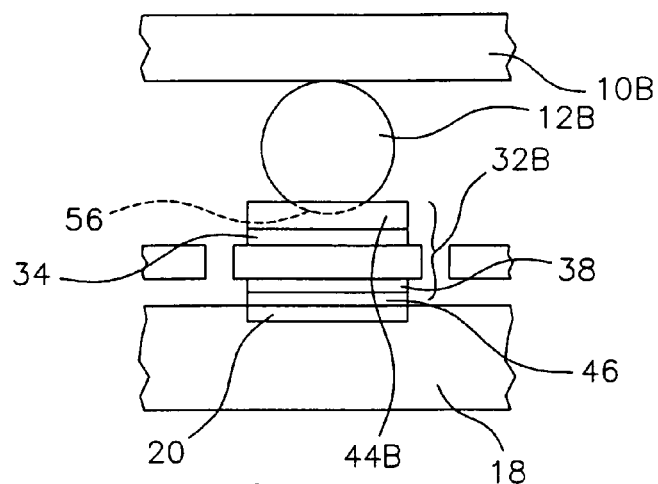
FIG. 2H is an enlarged side elevation view equivalent to FIG. 2E of an alternate embodiment contactor for bumped terminal contacts.

FIG. 2H illustrates an alternate embodiment contactor 32B configured to electrically engage bumped terminal contacts 12B on the component 10B (FIG. 1G). The contactor 32B is constructed substantially similar to the previously described contactor 32, but includes a first conductive polymer layer 32B having an indentation 56 configured to retain the bumped terminal contact 12B.

Figure 2I:
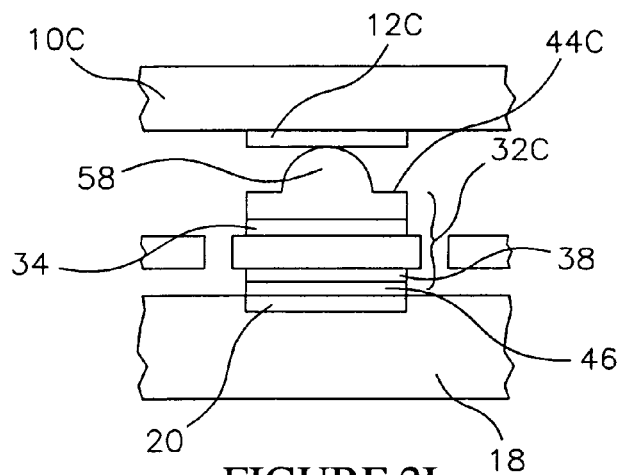
FIG. 2I is an enlarged side elevation view equivalent to FIG. 2E of an alternate embodiment contactor for planar terminal contacts.

FIG. 2I illustrates an alternate embodiment contactor 32C configured to electrically engage planar terminal contacts 12C on the component 10C (FIG. 1I). The contactor 32C is constructed substantially similar to the previously described contactor 32, but includes a first conductive polymer layer 32C having a bump 58 configured to engage the planar terminal contact 12C.

Referring to FIGS. 3A-3D, a second embodiment contact system 16A constructed in accordance with the invention is illustrated. The contact system 16A includes an interface board 18A, which is configured for mounting to an automated or manual test handler 14, as previously described.

The interface board 18A comprises an electrically insulating material, such as molded plastic, a glass filled resin (e.g., FR-4) or a ceramic. In addition, the interface board 18A includes a pattern of interface contacts 20A in electrical communication with test circuitry 22A. Further, the interface board 18A can include conductors 24A, such as conductive traces, and metal filled vias that electrically connect the interface contacts 20A to the test circuitry 22A.

In addition to the interface board 18A, the contact system 16A also includes a substrate 26A on the interface board 18A. As with the previous embodiment, the substrate 26A is configured to float on the interface board 18A on guide pins 28A (FIG. 3C) placed through openings 30A. In addition, the substrate 26A preferably comprises a flexible, electrically insulating organic material, such as a glass filled resin (e.g., FR-4).

The substrate 26A includes a pattern of contactors 32A configured to simultaneously electrically engage the terminal contacts 12A on the component 10A, and the interface contacts 20A on the interface board 18A. The substrate 26A also includes grooves 52A, such as saw cuts, that electrically isolate the contactors 32A from one another. In addition, the grooves 52A increase the flexibility, or compliancy of the contactors 32A and form flexible segments 54A as previously described.

Figure 3A:
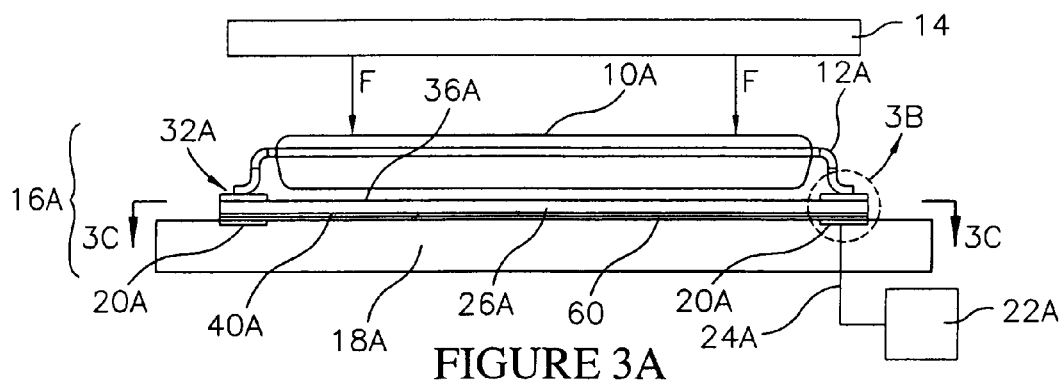
FIG. 3A is an end elevation view of a second embodiment conductive polymer contact system constructed in accordance with the invention.
Figure 3B:
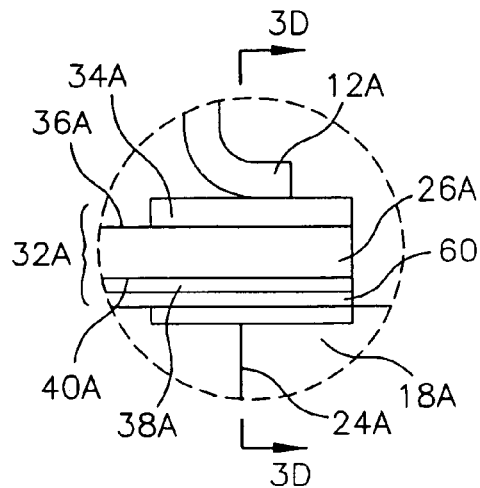
FIG. 3B is an enlarged view taken along line 3B of FIG. 3A.
Figure 3C:
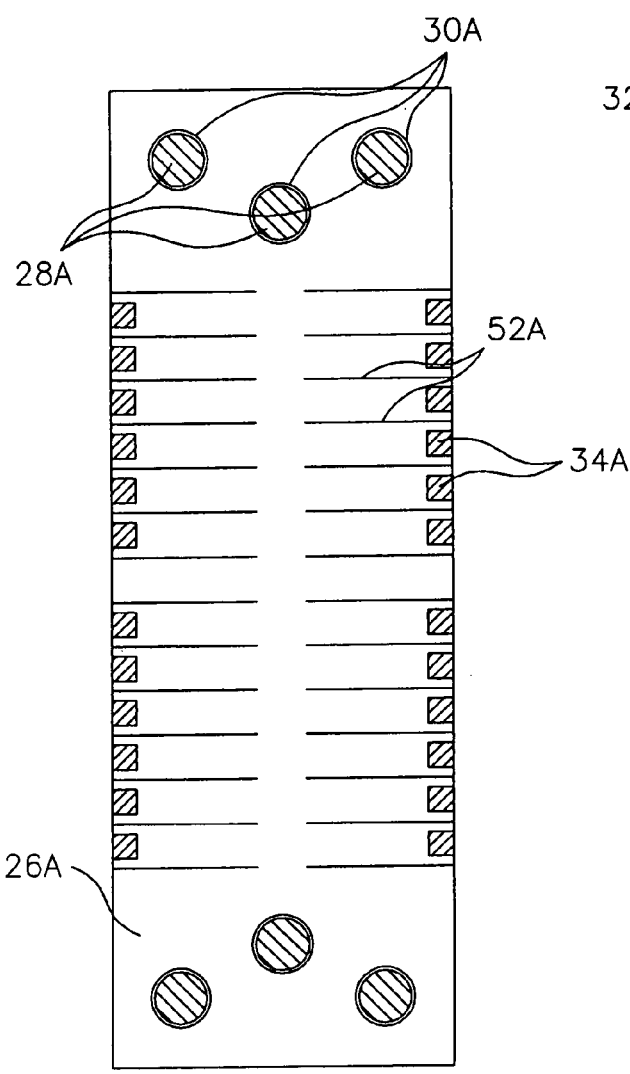
FIG. 3C is a cross sectional view taken along section line 3C-3C of FIG. 3A.
Figure 3D:
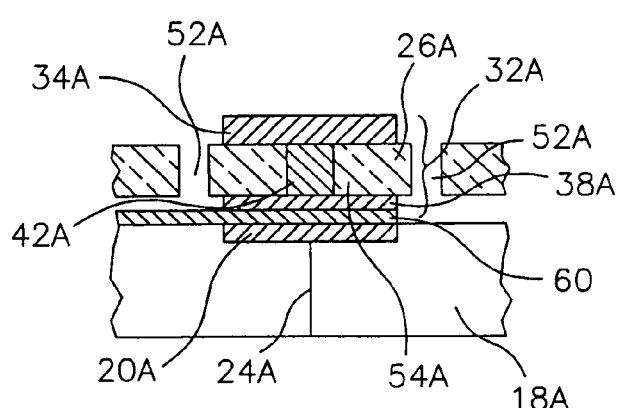
FIG. 3D is an enlarged cross sectional view taken along section line 3D-3D of FIG. 3B.

As shown in FIG. 3B, the contactors 32A include first contact pads 34A on a first side 36A of the substrate 26A, and second contact pads 38A on an opposing second side 40A of the substrate 26A. The contact pads 34A, 38A preferably comprise a non-oxidizing metal, such as gold or platinum. As shown in FIG. 3D, the contactors 32A also include conductive vias 42A which electrically connect the first contact pads 34A to the second contact pads 38A. The pattern of the first contact pads 34A exactly matches the pattern of the terminal contacts 12A on the component 10A. In addition, although the first contact pads 34A and the second contact pads 38A are shown as having matching patterns, the second contact pads 38A can be offset, or "fanned out" from the contact pads 34A. In this case the interface contacts 20A on the interface board 18 would also be offset, or fanned out, with respect to the first contact pads 34A.

The contact system 16A also includes a Z-axis anisotropic conductive polymer layer 60 between the substrate 26A and the interface board 18A. The Z-axis anisotropic conductive polymer layer 60 electrically connects the second contact pads 38A on the substrate 26A to the interface contacts 20A on the interface board 18A. Stated different, the Z-axis anisotropic conductive polymer layer 60 provides electrical conductivity in the Z direction. In addition, the Z-axis anisotropic conductive polymer layer 60 provides electrical isolation in the X and Y directions.

As with the previously described conductive polymer layers, the Z-axis anisotropic conductive polymer layer 60 can include conductive particles in flake or dendrite form. However, in this case the conductive particles are configured to provide anisotropic conductivity (i.e., conductivity in the Z direction, electrical isolation in the X and Y directions). Suitable Z-axis anisotropic conductive polymers are commercially available from different manufacturers including Shinetsu Chemical Co., Japan; EPI Technologies, Richardson Tex.; A.I. Technology, Trenton, N.J.; and Sheldahl, Northfield, Minn.

The contact system 16A can be used to test the component 10A substantially as previously described for contact system 16. In addition, the contact system 16A can be configured to electrically engage different types of terminal contacts on different types of components substantially as previously described.

Thus the invention provides a contact system, a contactor, and a test method for semiconductor components. Although the invention has been described with reference to certain preferred embodiments, as will be apparent to those skilled in the art, certain changes and modifications can be made without departing from the scope of the invention, as defined by the following claims.

I claim:

1. A method for testing a semiconductor component having a plurality of terminal contacts comprising:
    providing a board comprising a plurality of contacts in electrical communication with a test circuitry;
    providing a substrate configured to float on the board comprising a plurality of flexible segments configured to move independently of one another;

providing a plurality of movable test contactors on the substrate comprising first contacts on first side of the flexible segments configured to electrically engage the terminal contacts and second contacts on second opposing sides of the flexible segments in electrical communication with the first contacts, and a resilient anisotropic conductive polymer layer configured to electrically engage the second contacts and the contacts;

placing the component on the substrate with the first contacts electrically contacting the terminal contacts using movement of the first contacts, and the second contacts electrically contacting the contacts using a resiliency of the anisotropic conductive polymer layer; and applying test signals through the test contactors and the terminal contacts to the component.

2. The method of claim 1 wherein the flexible segments include conductive vias electrically connecting the first contacts and the second contacts.

3. The method of claim 1 further comprising applying a force to the component during the placing step.

4. The method of claim 1 wherein the substrate is configured to float on the board on guide pins.

5. The method of claim 1 wherein the terminal contacts comprise an element selected from the group consisting of leads, bumps and pads.

6. The method of claim 1 wherein the placing step is performed using a test handler.

7. A method for testing a semiconductor component having a terminal contact comprising:

providing a board comprising at least one contact in electrical communication with test circuitry;

providing a substrate configured to slide on the board comprising a flexible segment and at least one contactor configured to simultaneously electrically engage the contact and the terminal contact, the contactor comprising a first contact on a first side of the flexible seament configured to electrically engage the terminal contact, a second contact on a second side of the flexible segment in electrical communication with the first contact, and a resilient anisotropic conductive polymer layer configured to electrically engage the second contact and the contact;

placing the component on the board with the first contact free to move to make electrical contact with the terminal contact, and with the second contact using a resiliency of the anisotropic conductive polymer layer to make electrical contact with the contact; and applying test signals through the terminal contact, the contact, the second contact, and the anisotropic conductive polymer layer to the component.

8. The method of claim 7 wherein the substrate is configured to slide in a Z-direction on the board.

9. The method of claim 7 wherein the flexible segment includes a conductive via electrically connecting the first contact and the second contact.

10. The method of claim 7 wherein the terminal contact comprises an element selected from the group consisting of leads, bumps and pads.

11. The method of claim 7 wherein the component comprises an element selected from the group consisting of packages, BGA devices and modules.

12. A method for testing a semiconductor component having a plurality of terminal contacts comprising:

providing a board comprising a plurality of contacts in electrical communication with test circuitry;

providing a floating substrate on the board;

providing a plurality of test contactors on the substrate, each test contactor comprising a flexible segment on the substrate, a first contact on a first side of the flexible segment configured to electrically engage a terminal contact, a second contact on a second opposing side of the flexible segment in electrical communication with the first contact, and a resilient anisotropic conductive polymer configured to electrically engage the second contact and a contact on the board;

placing the component on the substrate with the test contactors free to move in a z-direction to make electrical contact with the terminal contacts, and with the anisotropic conductive polymer providing resiliency for making contact with the contacts on the board; and applying test signals through the test contactors and the terminal contacts to the component.

13. The method of claim 12 wherein each test contactor includes a conductive via in the flexible segment electrically connecting the first contact and the second contact.

14. The method of claim 12 wherein the anisotropic conductive polymer comprises an elastomeric base material and a plurality of conductive particles in the base material.

15. The method of claim 12 wherein the test contactors move independently in the z-direction during the placing step.

16. The method of claim 12 wherein the placing step is performed using a test handler.

17. The method of claim 12 wherein the substrate comprises an opening and the board comprises a pin for physically engaging the opening.

* * * * *

UNITED STATES PATENT AND TRADEMARK OFFICE
CERTIFICATE OF CORRECTION

| | |
|---|---|
| PATENT NO. | : 7,265,563 B2 |
| APPLICATION NO. | : 11/152712 |
| DATED | : September 4, 2007 |
| INVENTOR(S) | : Cram |

It is certified that error appears in the above-identified patent and that said Letters Patent is hereby corrected as shown below:

In column 9, line 39, in Claim 7, delete "seament" and insert -- segment --, therefor.

Signed and Sealed this

Thirteenth Day of November, 2007

JON W. DUDAS
*Director of the United States Patent and Trademark Office*